United States Patent [19]

Mori et al.

[11] Patent Number: 4,897,654
[45] Date of Patent: Jan. 30, 1990

[54] DIGITAL-ANALOG CONVERTING METHOD, AND APPARATUS THEREFOR

[76] Inventors: Ryoichi Mori, 1-24-12, Hakusan, Bunkyo-ku, Tokyo 113; Kazuo Toraichi, 1-14-2, Irimagawa, Sayama-shi, Saitama 350-13, both of Japan

[21] Appl. No.: 263,256

[22] Filed: Oct. 27, 1988

[30] Foreign Application Priority Data

Oct. 30, 1987 [JP] Japan .................................. 62-274806

[51] Int. Cl.$^4$ ............................................. H03M 1/66
[52] U.S. Cl. .................................................... 341/147
[58] Field of Search ........................ 341/147, 144, 126

[56] References Cited

U.S. PATENT DOCUMENTS

| | | | |
|---|---|---|---|
| 3,480,767 | 11/1969 | Howe | 341/147 X |
| 3,794,995 | 2/1974 | Thompson | 341/147 X |
| 4,021,648 | 5/1977 | Sakata | 341/147 X |
| 4,068,178 | 1/1978 | Tunzi | 341/147 X |

*Primary Examiner*—William M. Shoop, Jr.
*Assistant Examiner*—Sharon D. Logan
*Attorney, Agent, or Firm*—Staas & Halsey

[57] ABSTRACT

A continuous analog signal is produced by successively generating digital data $V_K$ ($K = \ldots, -4, -3, -2, -1, 0, 1, 2, 3, \ldots$) every predetermined sampling period T, repeatedly generating, successively at a period 3T, signals $\phi(t+T)$, $\phi(t)$, $\phi(t-T)$, where a unit pulse response signal $\psi(t)$ is expressed by $$\psi(t) = \Sigma A_K \cdot \phi(t - K \cdot T) \ (K = -\infty \sim +\infty)$$

using a signal $\phi(t)$ ($0 \leq t \leq 3 \cdot T$) expressed by three piecewise polynomials, computing C in accordance with the equation $$C = \Sigma A_{-K} \cdot V_K \ (K = -M \sim m)$$

every sampling period T, where $V_0$ represents digital data prevailing at the present time, cyclically storing the results of computation as $C_{-1}$, $C_0$, $C_1$ in successive fashion, and converting the digital data into an analog quantity in accordance with the equation $$C_{-1} \cdot \phi(t+T) + C_2 \cdot \phi(t) + C_3 \cdot \phi(t-T)$$

7 Claims, 14 Drawing Sheets

| $\phi_0(t+T)$ | $\phi_0(t)$ | $\phi_0(t-T)$ |
|---|---|---|
| $V_3 \cdot A_{-4}$ | $V_4 \cdot A_{-4}$ | $V_5 \cdot A_{-4}$ |
| $V_2 \cdot A_{-3}$ | $V_3 \cdot A_{-3}$ | $V_4 \cdot A_{-3}$ |
| $V_1 \cdot A_{-2}$ | $V_2 \cdot A_{-2}$ | $V_3 \cdot A_{-2}$ |
| $V_0 \cdot A_{-1}$ | $V_1 \cdot A_{-1}$ | $V_2 \cdot A_{-1}$ |
| $V_{-1} \cdot A_0$ | $V_0 \cdot A_0$ | $V_1 \cdot A_0$ |
| $V_{-2} \cdot A_1$ | $V_{-1} \cdot A_1$ | $V_0 \cdot A_1$ |
| $V_{-3} \cdot A_2$ | $V_{-2} \cdot A_2$ | $V_{-1} \cdot A_2$ |
| $V_{-4} \cdot A_3$ | $V_{-3} \cdot A_3$ | $V_{-2} \cdot A_3$ |
| $V_{-5} \cdot A_4$ | $V_{-4} \cdot A_4$ | $V_{-3} \cdot A_4$ |

DIGITAL-ANALOG CONVERTING METHOD, AND APPARATUS THEREFOR

BACKGROUND OF THE INVENTION

This invention relates to a digital-analog converting method and apparatus, and more particularly, to a digital-analog converting method and apparatus suitable for use in converting a digital audio signal into an analog audio signal.

In compact disc players (CD players) or digital tape recording/playback devices (DAT devices), it is required that musical signals expressed in digital form be converted into analog signals prior to output.

Figure 12:
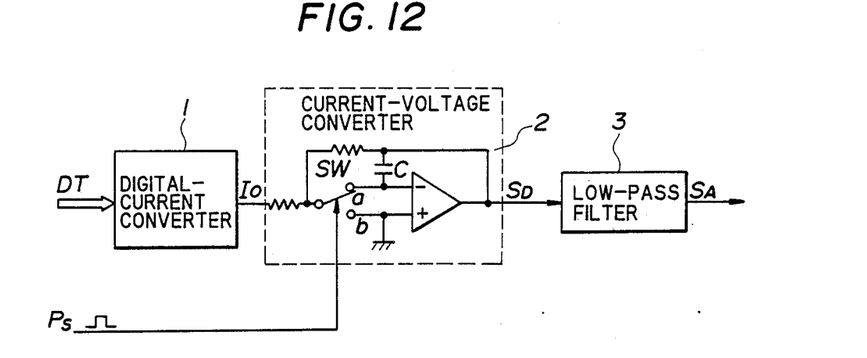
FIG. 12 is a block diagram of a digital-analog converter according to the prior art.
Figure 13:
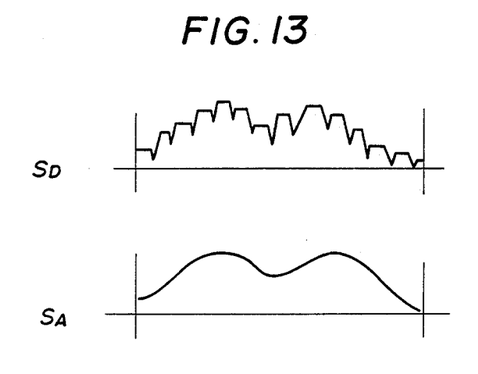
FIG. 13 is a waveform diagram of waveforms associated with the converter of FIG. 12.

As shown in FIG. 12, a commonly employed digital-analog converter (hereinafter referred to as a "DA converter") for playing back music includes a digital current converter 1 for converting digital data DT, which is inputted at a certain sampling period, into a direct current $I_o$, a current-voltage converter 2 for converting the current $I_o$ into a voltage $S_D$ (see FIG. 13), and for holding the voltage, each time a sampling pulse $P_s$ is generated, and a low-pass filter 3 for forming the output voltage $S_D$ into a continuous, smooth analog signal $S_A$, which is the output of the filter 3. The current-voltage converter 2 includes a switch SW having a movable contact changed over by the sampling pulse $P_s$. When the movable contact is switched to a contact a, as shown in FIG. 12, an integrator is formed to generate the voltage $S_D$, which conforms to the current $I_o$. When the movable contact is switched to a contact b, a holding circuit is formed to hold the voltage $S_D$.

The foremost problems encountered in the DA converter for music playback are the precision with which the digital data is converted into a current value, the speed at which the conversion is made and phase distortion caused by the low-pass filter.

The problems of conversion precision and conversion speed have largely been solved by higher speed LSI's and advances in trimming techniques. Though phase distortion ascribable to the low-pass filter can be mitigated by employing a digital filter, phase distortion cannot be eliminated completely so long as the filter is an integral part of the structure.

Figure 14A:
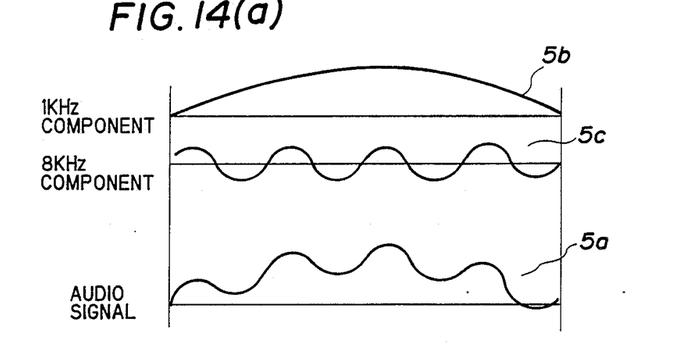
FIGS. 14 and 15 are views for describing phase distortion and waveform distortion in the digital-analog converter of the prior art.
Figure 14B:
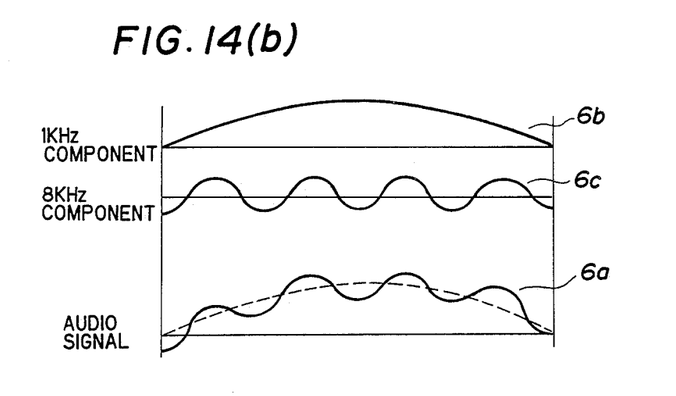

FIG. 14 is useful in describing phase distortion. FIG. 14(a) illustrates an original audio signal waveform 5a, a 1 KHz component waveform 5b, and an 8 KHz component waveform 5c. FIG. 14(b) illustrates an audio signal waveform 6a outputted by the low-pass filter 3 (FIG. 12), a 1 KHz component waveform 6b, and an 8 KHz component waveform 6c. It will be understood from these waveforms that, due to the delay in the phase of the 8 KHz component, the output audio signal 6a is different from the original audio signal 5a, and that this phase distortion becomes particularly pronounced at high frequencies. Thus, the presence of the low-pass filter results in a major deterioration in sound quality.

Figure 15:
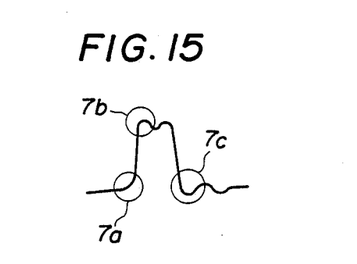

As shown in FIG. 15, the low-pass filter output when a pulsed signal is applied to the filter is sluggish at a leading edge 7a and oscillates at an envelope portion 7b and trailing edge 7c. Consequently, when a musical signal exhibiting a large impulse variation is applied to the low-pass filter, sound quality changes greatly and there are times when even the rhythmical sense of the musical signal differs.

Figure 16:
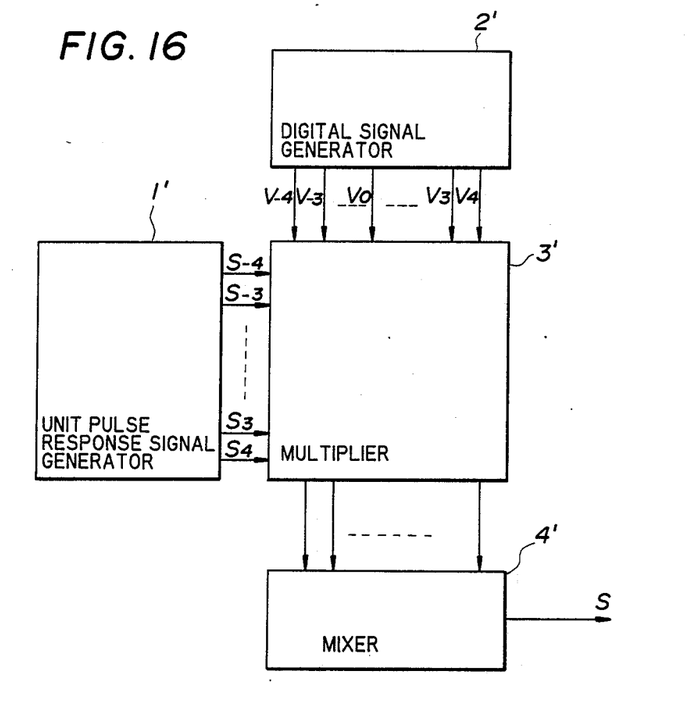
FIGS. 16 through 18 are views for describing the general features of a proposed digital-analog converter.

To overcome these disadvantages, the inventors have proposed a digital-analog converter which, as shown in FIG. 16, includes a unit pulse response signal generator 1' for generating unit pulse response signals SP (see FIG. 17), a digital data generator 2' for generating 16-bit digital audio data at a predetermined time interval $\Delta T$, a multiplier 3' for multiplying a unit pulse response signal generated at a certain time by a predetermined item of the digital audio data, and a mixer 4' for producing an analog signal output by combining the unit pulse response signals that have been multiplied by the digital audio data. By way of example, refer to the specification of U.S. Ser. No. 171,812 (entitled "Digital-Analog Converter", filed on Mar. 22, 1988).

Figure 17:
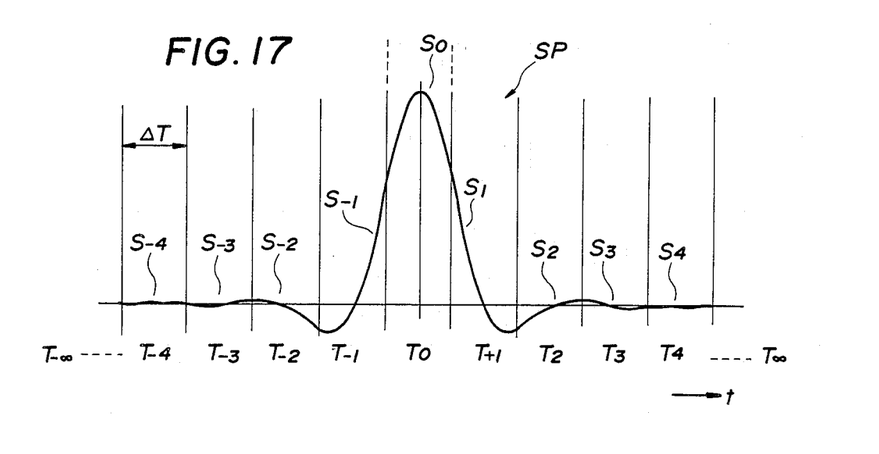
Figure 18A:
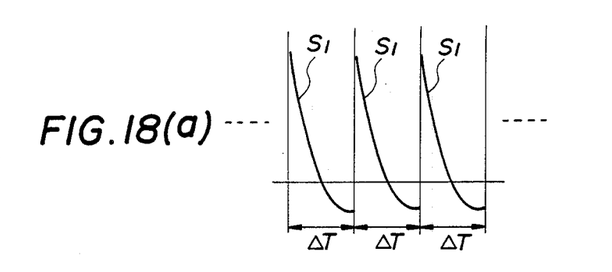
Figure 18B:
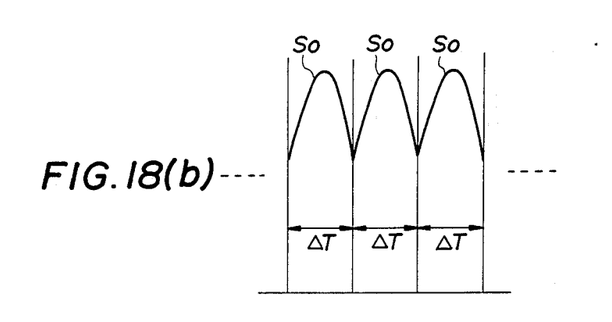
Figure 18C:
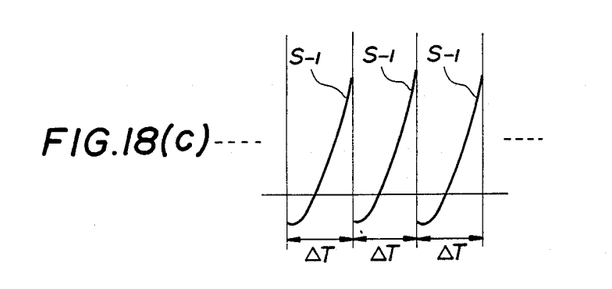

In accordance with this proposed digital-analog converter, the unit pulse response generator 1' partitions a unit pulse response signal SP at a predetermined time interval $\Delta T$ (see FIG. 17). When this is done, partial signals $S_K$, which result from the partitioning operation, are repeatedly generated at the time interval $\Delta T$, as shown in FIG. 18 (where only $S_{-1}$, $S_0$ and $S_1$ are illustrated). The digital data generator 2' stores 16-bit digital audio data $V_K$, which is generated at the predetermined time interval $\Delta T$, in internal shift registers while sequentially shifting the same. Multiplying-type DA converters in the multiplier 3' respectively multiply the partial signals $S_K$ by predetermined 16-bit digital audio data $V_{-K}$ stored in the shift registers corresponding to the partial signals. The mixer 4' combines the signals outputted by the multiplying-type DA converters, thereby producing an analog signal output $S_A$ ($=\Sigma S_K \cdot V_{-K}$). This digital-analog converter makes it possible to generate a continuous analog signal that is free of phase distortion.

Figure 19:
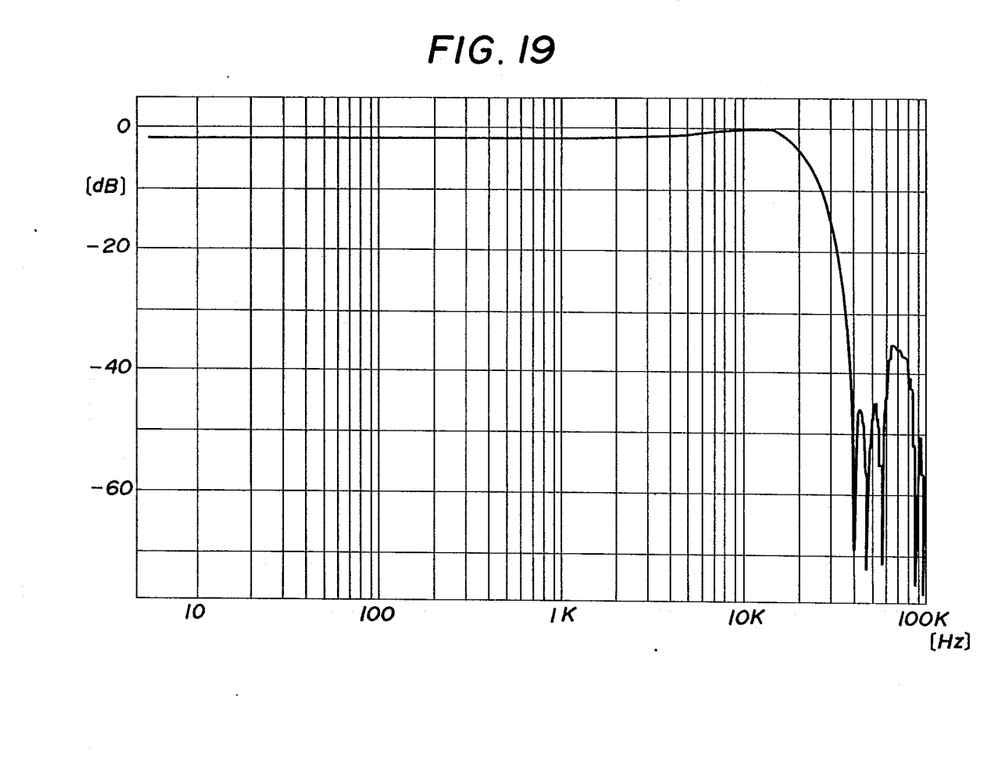
FIG. 19 is a frequency characteristic for describing the drawbacks of the prior art.

The proposed digital-analog converter takes into consideration the fact that the unit pulse response signal (FIG. 17) is sharply attentuated prior to a time slot $T_{-5}$ and after a time slot $T_5$, and approximates the unit pulse response signal SP by nine partial signals $S_{-4}$ through $S_4$ in nine time slots $S_{-4}$ through $S_4$, respectively. For this reason, the proposed digital-analog converter requires nine partial signal generators, a memory circuit composed of nine shift registers, and nine multiplying-type DA converters. This is disadvantageous in terms of an increase in size and cost. If it is attempted to approximate the unit pulse response signal by a fewer number of partial signals in an effort to reduce the number of partial signal generators, the number of shift registers in the memory circuit and the number of multiplying-type DA converters, a new problem will arise in which the frequency characteristic of the analog signal output of the digital-analog converter undergoes a fluctuation in level in the audible band, as shown in FIG. 19.

Figure 20A:
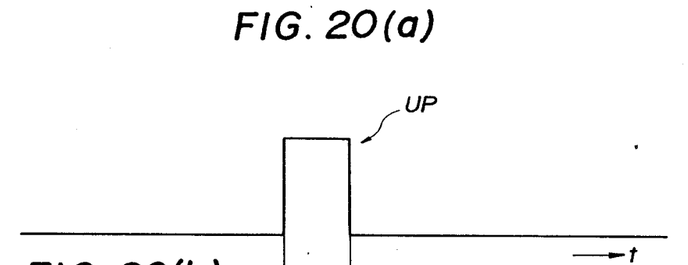
FIG. 20 is a waveform diagram for describing the drawbacks of the prior art.
Figure 20B:
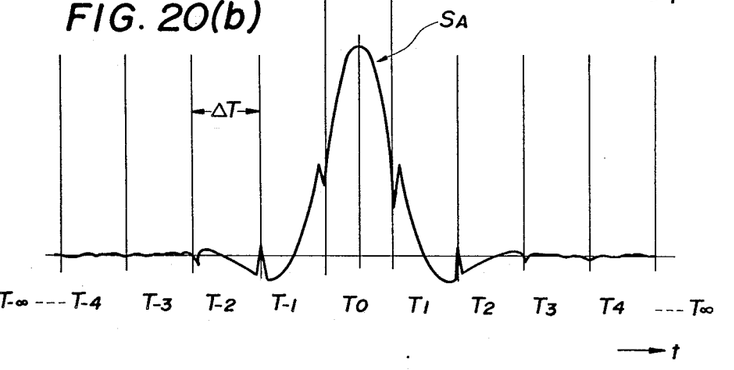

Further, the partial signal waveforms $S_K$ inputted to the multiplying-type DA converters in the proposed digital-analog converters become discontinuous at the interval $\Delta T$, as shown in FIG. 18. A problem that arises is that, due to this signal discontinuity and the settling time of the multiplying-type DA converters, the analog signal $S_A$ outputted by the mixer 4' picks up spike-shaped noise every $\Delta T$. Moreover, the waveform of the analog signal $S_A$ when a unit pulse UP is inputted to the proposed digital-analog converter is as shown in FIG. 20. Though the analog signal $S_A$ must take on the waveform shown in FIG. 17 in a case where the unit pulse UP is applied, the waveform that results is one in which the analog signal picks up spike noise every $\Delta T$ owing the settling time of the multiplying-type DA converters.

SUMMARY OF THE INVENTION

An object of the present invention is to provide a digital-analog converting method and apparatus capable of generating a continuous analog signal that is free of phase distortion.

Another object of the present invention is to provide a digital-analog converting method and apparatus through which it is possible to reduce the number of circuit units such as the multiplying-type DA converters, improve the S/N ratio and produce a flat frequency characeristic, namely one in which there is no level fluctuation in the audible band.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIGS. 2 through 9 are views useful in describing the principle of the invention, in which:

DESCRIPTION OF THE PREFERRED EMBODIMENT

Figure 1:
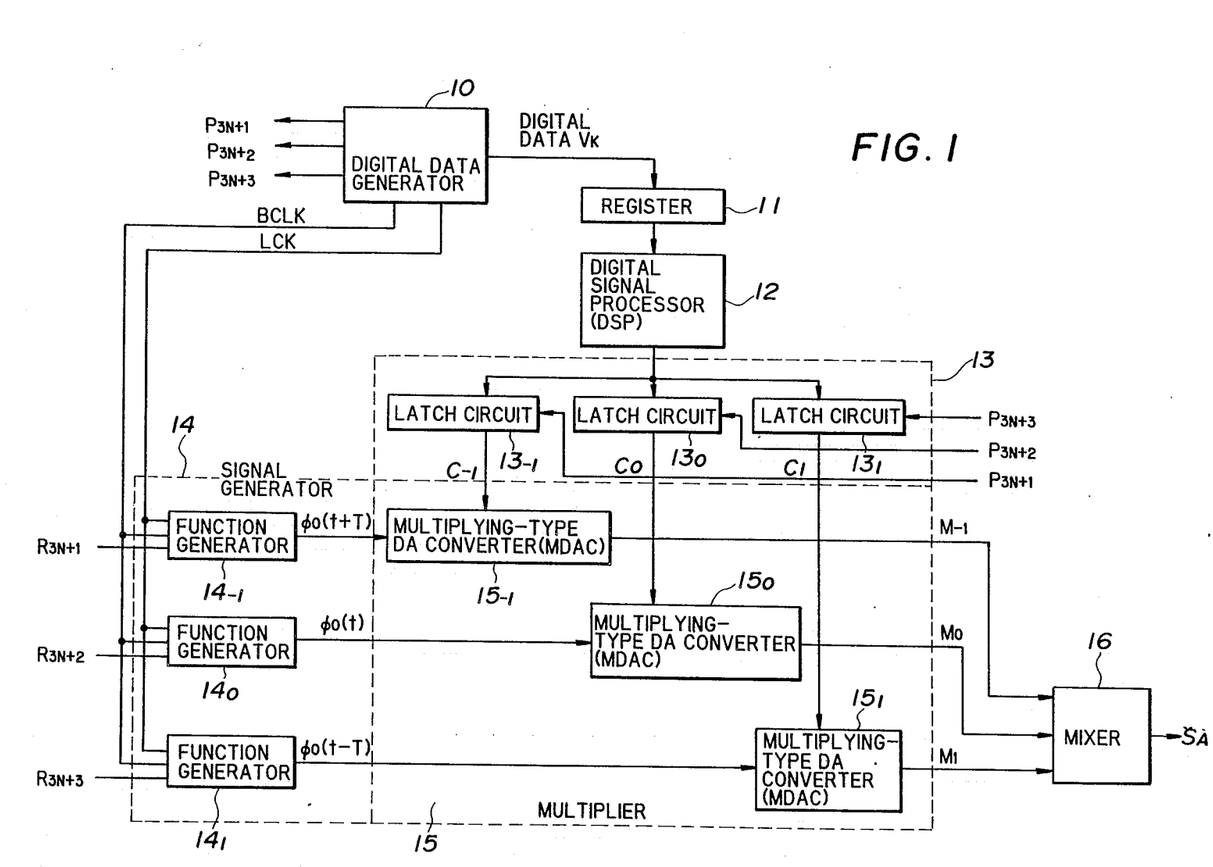
FIG. 1 is a block diagram of a digital-analog converter for realizing the system of the present invention.

The principle of the invention will now be described in accordance with FIGS. 2 through 9, after which a digital-analog converter according to the invention will be described in accordance with FIG. 1.

Figure 2:
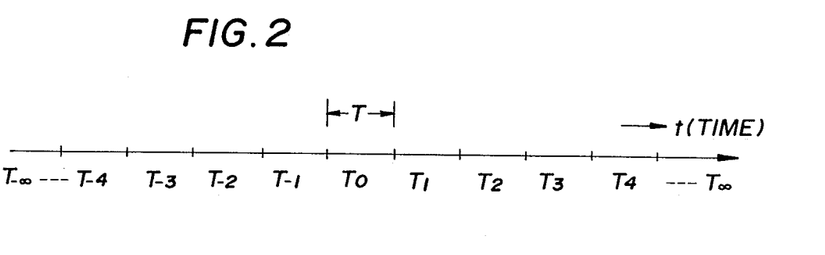
FIG. 2 is a view for describing time slots in a case where a time axis is divided at intervals of $\Delta T$.
Figure 3:
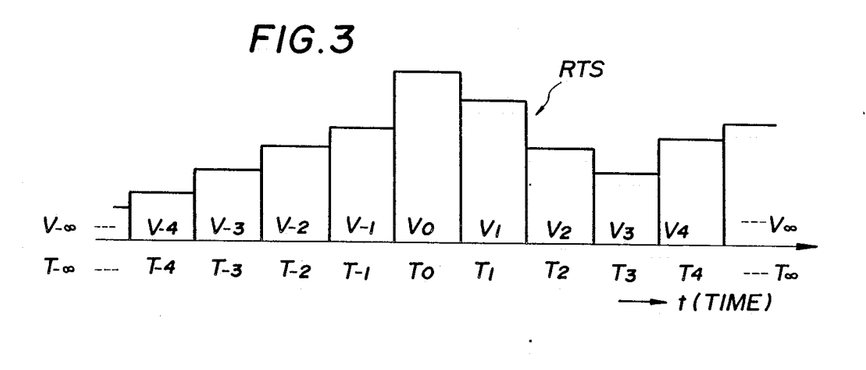
FIG. 3 is a view for describing digital data in each time slot.

If a time axis is divided at a predetermined time interval T, as shown in FIG. 2, and a discrete time signal value (digital value) in each time slot $T_K$ ($K = T_{-4}$, $T_{-3}$, $T_{-2}$, $T_{-1}$, $T_0$, $T_1$, $T_2$, $T_3$, $T_4$, ...) is designated by $V_K$, as shown in FIG. 3, then a continuous signal conforming to the discrete time signals RTS is obtained by superposing, along the time axis, pulse response signals weighted by the digital data $V_K$ inputted from one moment to the next.

Figures 4A, 4B:
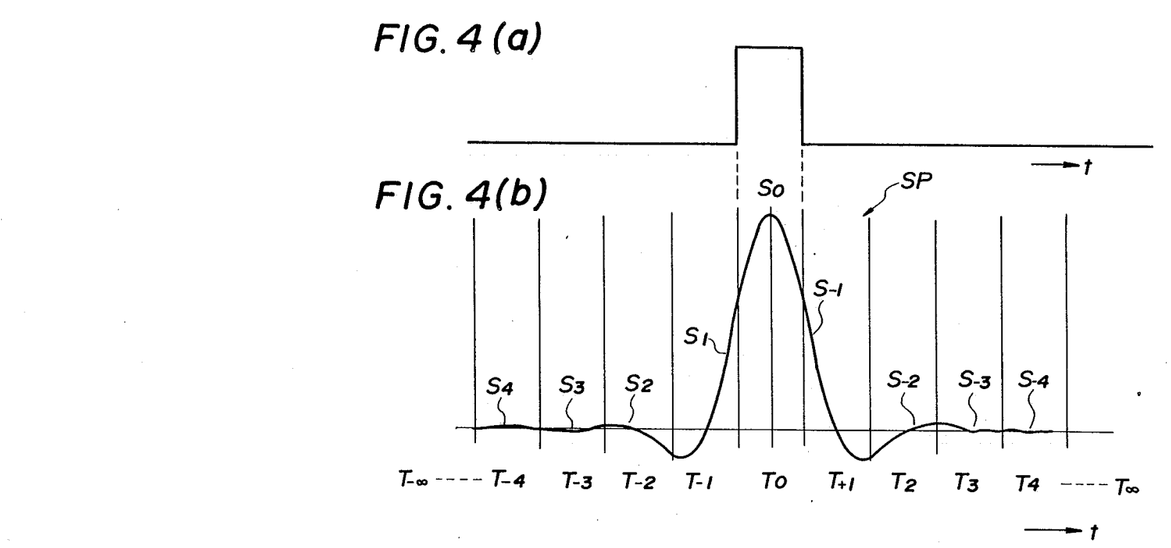
FIG. 4 is a signal waveform diagram of one embodiment of unit pulse response.

FIG. 4(a) shows a unit pulse in the time slot $T_0$, and FIG. 4(b) is a waveform diagram illustrating a unit pulse response signal SP corresponding to the unit pulse signal. The waveform of signal SP is a spline signal waveform illustrative of an embodiment of the invention. It should be noted that the unit pulse response signal covers an interval extending from $-\infty$ to $+\infty$ on the time axis and is sharply attenuated from the time slot $T_0$ toward $-\infty$ and $+\infty$.

Figure 5:
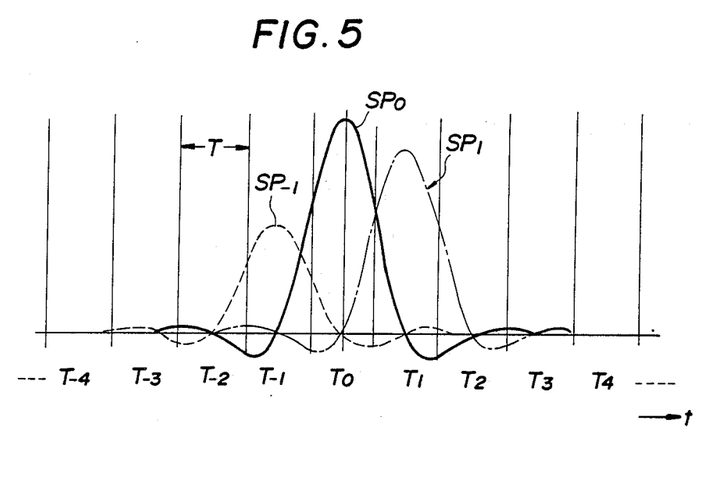
FIG. 5 is a pulse response signal waveform diagram corresponding to three continuous digital signals.

Focusing solely on the digital data $V_{-1}$, $V_0$, $V_1$ in the time slots $T_{-1}$, $T_0$, $T_1$ of the discrete time signals RTS shown in FIG. 3, it is seen that the pulse response signals $SP_{-1}$, $SP_0$, $SP_1$ corresponding to the digital data $V_{-1}$, $V_0$, $V_1$ are as indicated by the dashed line, solid line and one-dot chain line, respectively, shown in FIG. 5. Therefore, by combining these pulse response signals in order every T starting from the old time slot $T_K$ ($K = -\infty, \ldots -2, -1, 0, 1, 2, \ldots$) and outputting the result, a continuous time signal corresponding to the three items of digital data $V_{-1}$, $V_0$, $V_1$ is obtained. Note that the pulse response signals $SP_{-1}$, $SP_0$, $SP_1$ in FIG. 5 are the result of multiplying the unit pulse response signal SP [see FIG. 4(b)] by $V_{-1}$, $V_0$, $V_1$, respectively.

The foregoing refers to three items of digital data. However, a continuous time signal can be obtained in similar fashion even when the digital data in all of the time slots are considered. In view of the fact that the pulse response signals are sharply attenuated, it will suffice if the number of pulse response signals to be combined in each time slot is nine at most. In other words, let $T_K$ represent the present time slot. If the pulse response signals corresponding to the nine items of digital data in the time slots $T_{K-4}$ through $T_{K+4}$ are combined, a sufficiently accurate continuous time signal is obtained in time slot $T_K$.

However, in accordance with the method of combining the pulse response waveforms corresponding to the nine items of digital data, as described earlier, nine circuit units are required, thereby resulting in a larger and more costly apparatus, and the unit pulse response signal waveforms are of a complicated nature so that the signals are discontinuous, the analog signal picks up noise and a high S/N ratio is required.

Accordingly, if the unit pulse response signal SP can be expressed using simpler function signals in short intervals, then the function signals can be used directly without being partitioned. This will eleiminate discontinuity and make it possible to reduce the number of circuit units required.

A function $\psi(t)$ illustrating the unit pulse response signal SP shown in FIG. 4(b) can be expressed by the following equations using another function $\phi_K(t)$:

$$\psi(t) = \Sigma A_K \cdot \phi_K(t) \quad (K = -\infty \sim +\infty) \tag{1}$$

$$A_K = \sqrt{2}(-3 + 2\sqrt{2})^{|K|} \tag{2}$$

Figure 6:
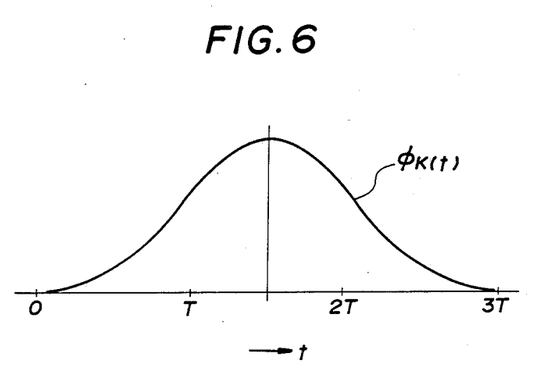
FIG. 6 is a waveform diagram of a function $\phi_K(t)$ when a unit pulse response signal is expressed by $\Sigma A_K \phi_K(t)$.

Here $\phi(t)$ has a waveform in which three sampling times 3T constitute one period, as shown in FIG. 6, and is expressed by three piecewise polynomials. That is, $\phi(t)$ can be expressed as follows:

$$\phi(t) = (9/2) \cdot (t/3T)^2 \quad (0 \leq t < T)$$

$$\phi(t) = -9 \cdot (t/3T - \tfrac{1}{2})^2 + \tfrac{3}{4} \quad (T \leq t < 2T)$$

$$\phi(t) = (9/2) \cdot (t/3T - 1)^2 \quad (2T \leq t < 3T)$$

Further, if the function indicated by the solid line from time 0 to 3T is expressed by $\phi_0(t)$, a function m sampling times earlier is expressed by $\phi_{-m}(t)$ and a function m sampling times later is expressed by $\phi_m(t)$, then we may write $$\phi_{-m}(t) = \phi_0(t + m \cdot T) \tag{3}$$

$$\phi_m(t) = \phi_0(t - m \cdot T) \tag{4}$$

Calculating the coefficients $A_K$ from Eq. (2) gives $$A_{-4} = A_4 = \sqrt{2}(-3 + 2\sqrt{2})^4 = 0.0012727$$

$$A_{-3} = A_3 = \sqrt{2}(-3 + 2\sqrt{2})^3 = -0.0071488$$

$$A_{-2} = A_2 = \sqrt{2}(-3 + 2\sqrt{2})^2 = 0.041632$$

$$A_{-1} = A_1 = \sqrt{2}(-3 + 2\sqrt{2})^1 = -0.24264$$

$$A_0 = \sqrt{2}(-3 + 2\sqrt{2})^0 = 1.41421$$

Therefore, $A_K \phi_K(t)$ ($K = -\infty \sim +\infty$) in Eq. (1) becomes as shown in FIG. 7(b) (where only the waveforms for $K = -1, 0, 1$ are depicted). When these are combined, a unit pulse response signal (t) is obtained, as indicated by the dashed line.

If three items of digital data which are continuous in the sampling period T are expressed by ..., $V_{-1}$, $V_0$, $V_1$, ... in order from the oldest to the newest, then the pulse response signals ..., $\psi_{-1}(t)$, $\psi_0(t)$, $\psi_1(t)$, ... can be written as follows using Eqs. (1)–(4), respectively:

$$\begin{aligned}\psi_{-1}(t) &= \Sigma V_{-1} \cdot A_K \cdot \phi_K(t + T) \\ &= \ldots + V_{-1}A_{-1}\phi_0(t + 2T) + V_{-1}A_0\phi_0(t + T) + \\ &\quad V_{-1}A_1\phi_0(t) + \ldots\end{aligned} \tag{5}$$

$$\begin{aligned}\psi_0(t) &= \Sigma V_0 \cdot A_K \cdot \phi_K(t) \\ &= \ldots + V_0 A_{-1}\phi_0(t + T) + V_0 A_0 \phi_0(t) + \\ &\quad V_0 A_1 \phi_0(t - T) + \ldots\end{aligned} \tag{6}$$

$$\begin{aligned}\psi_1(t) &= \Sigma V_1 \cdot A_K \cdot \phi_K(t - T) \\ &= \ldots + V_1 A_{-1}\phi_0(t) + V_1 A_0 \phi_0(t - T) + \\ &\quad V_1 A_1 \phi_0(t - 2T) + \ldots\end{aligned} \tag{7}$$

Figure 8:
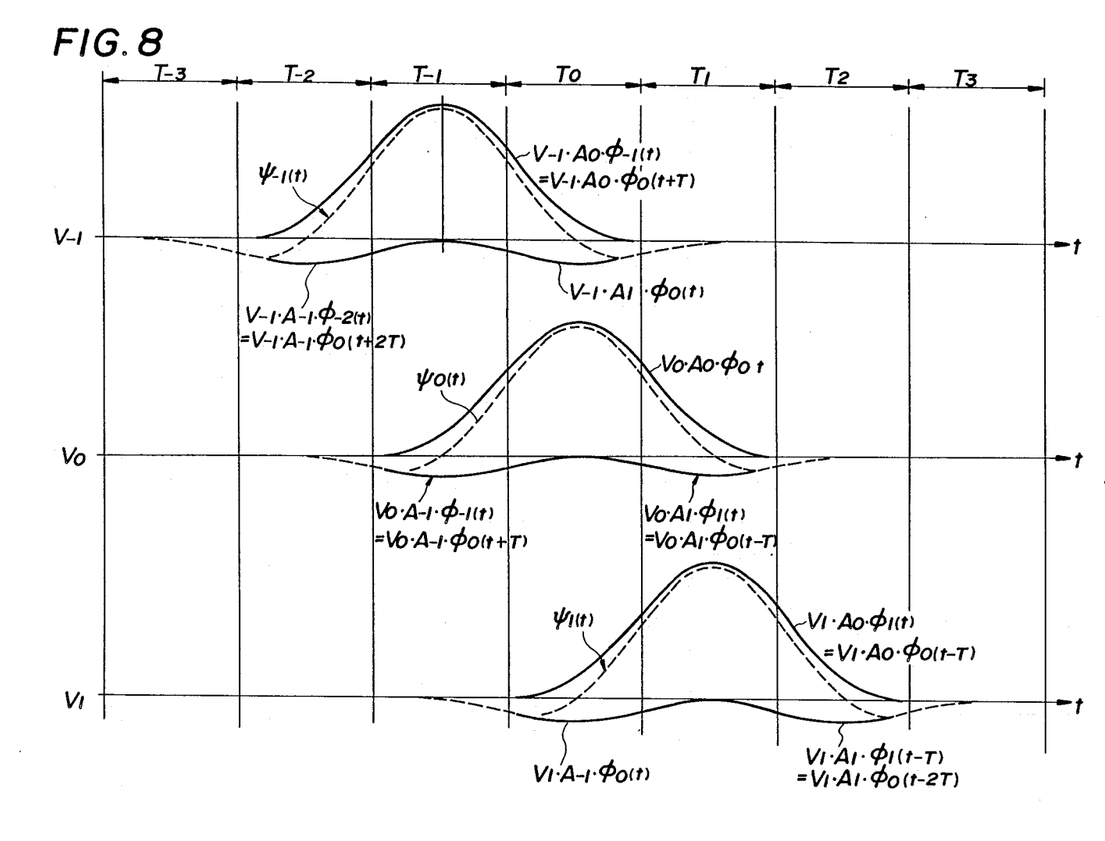
FIG. 8 shows pulse response signal waveform diagrams for three continuous digital signals $V_{-1}$, $V_0$, $V_1$.

The result is as shown in FIG. 8. It should be noted that the items of digital data $V_{-1}$, $V_0$, $V_1$ are illustrated as having identical values in FIG. 8.

Extracting the coefficients of the function $\phi_0(t)$ from Eqs. (5) through (7) gives us $$V_{-1}A_1, \; V_0 A_0, \; V_1 A_{-1}$$

Figure 9:
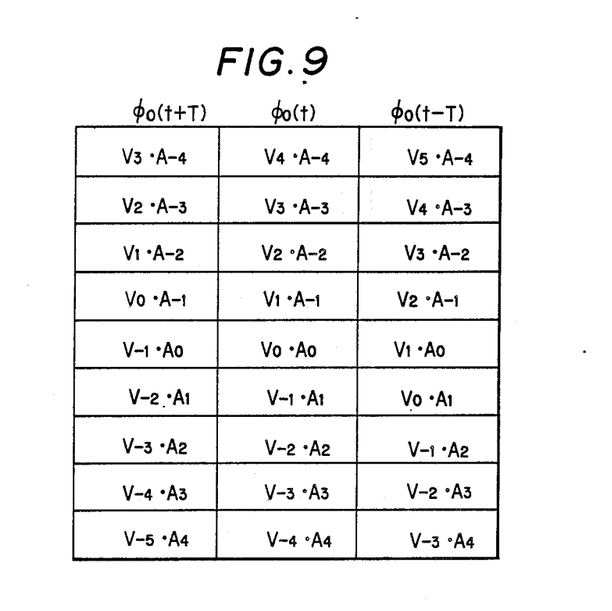
FIG. 9 is a view for describing coefficient totaling processing performed by a digital signal processor.

In the foregoing, only the three items of data $V_{-1}$, $V_0$, $V_1$ are considered. If nine items of continuous digital data $V_{-4}$–$V_4$ are taken into consideration, the coefficients of the function $\phi_0(t)$ become as follows, as illustrated in FIG. 9:

$$V_4 A_{-4}, \; V_3 A_{-3}, \; V_2 A_{-2}, \; V_1 A_{-1}, \; V_0 A_0,$$

$$V_{-1}A_1, \; V_{-2}A_2, \; V_{-3}A_3, \; V_{-4}A_4 \tag{8}$$

Similarly, extracting the coefficients of the function $\phi_0(t+T)$ from Eqs. (5) through (7) gives us $$V_{-1} \cdot A_0, \; V_0 \cdot A_{-1}$$

If nine items of continuous digital data are taken into consideration, the coefficients of the function $\phi_0(t+T)$ become as follows, as illustrated in FIG. 9:

$$V_3 A_{-4}, \; V_2 A_{-3}, \; V_1 A_{-2}, \; V_0 A_{-1}, \; V_{-1}A_0,$$

$$V_{-2}A_1, \; V_{-3}A_2, \; V_{-4}A_3, \; V_{-5}A_4 \tag{9}$$

Further, extracting the coefficients of the function $\phi_0(t-T)$ from Eqs. (5) through (7) gives us $$V_0 \cdot A_1, \; V_1 \cdot A_0$$

If nine items of continuous digital data are taken into consideration, the coefficients of the function $\phi_0(t-T)$ become as follows, as illustrated in FIG. 9:

$$V_5 A_{-4}, \; V_4 A_{-3}, \; V_3 A_{-2}, \; V_2 A_{-1}, \; V_1 A_0,$$

$$V_0 A_1, \; V_{-1}A_2, \; V_{-2}A_3, \; V_{-3}A_4 \tag{10}$$

Thus, if the result of totaling the coefficients shown in Eq. (9) and multiplying the function $\phi(t+T)$ by the total, the result of totaling the coefficients shown in Eq. (8) and multiplying the function $\phi(t)$ by the total, and the result of totaling the coefficients shown in Eq. (10) and multiplying the function $\phi(t-T)$ by the total are combined to produce an output, a continuous analog signal corresponding to a series of digital data can be obtained.

A digital-analog converter in accordance with the present invention will now be described with reference to FIG. 1. Shown in FIG. 1 are a register 11 for storing digital data, a digital signal processor (DSP) 12, a latch section 13 having three latch circuits $13_{-1}$–$13_1$, a signal generator 14 having function generators $14_{-1}$, $14_0$, $14_1$ for generating functions $\phi_0(t+T)$, $\phi_0(t)$, $\phi_0(t-T)$, respectively, a multiplier 15 having three multiplying-type DA converters $15_{-1}$ ~ $15_1$ connected to the latch section 13 and signal generator 14, and a mixer 16 for combining a plurality of signals $M_{-1}$, $M_0$, $M_1$, which are outputted by the multiplier 15, to produce an analog signal output $S_A$.

The digital data generator 10 generates a bit clock BCLK, data latching pulses $P_{3N+1}$ ~ $P_{3N+3}$ and a ROM data latching pulse LCK. The generator 10 also generates, and stores successively in the register 11, the digital data $V_K$ (see FIG. 3) of, e.g., 16 bits, at the predetermined time (sampling time) interval T. The frequency of the bit clock BCLK is $a \cdot f_s$ ($a = 64$, by way of example) where the sampling frequency is $f_s$ ($= 1/T$). The period of the data latching pulses $P_{3N+1}$ ~ $P_{3N+3}$ is 3T, with these latching pulses being successively displaced in phase by T.

The digital signal processor 12 computes the total C of the coefficients indicated in Eq. (8) using the latest nine items of digital data and successively stores the results cyclically in the latch circuits $13_{-1}$ ~ $13_1$. More specifically, at the time of time slot $T_{-1}$, a total $C_{-1}$ of the coefficients indicated in Eq. (9) is computed and stored in the latch circuit $13_{-1}$; at the time of time slot $T_0$, a total $C_0$ of the coefficients indicated in Eq. (8) is computed and stored in the latch circuit $13_0$; and at the time of time slot $T_1$, a total $C_1$ of the coefficients indicated in Eq. (10) is computed and stored in the latch circuit $13_1$. Thereafter, the total value C of the coefficients computed by the digital signal processor 12 is successively stored in the latch circuits $13_{-1} \rightarrow 13_0 \rightarrow 13_1 \rightarrow \ldots$ as $C_{-1}, C_0, C_1$ whenever new digital data is generated at the sampling period.

Figure 10:
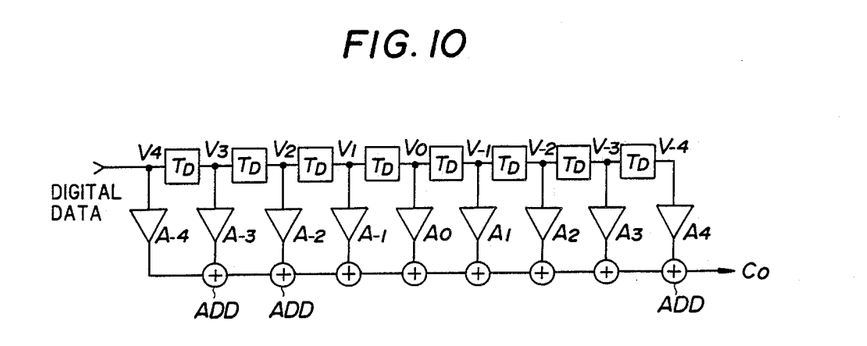
FIG. 10 is a functional block diagram illustrating the processing performed by the digital signal processor.

FIG. 10 is a block diagram for describing the processing performed by the digital signal processor 12. TD denotes delay circuits for storing digital data during one sampling period T and shifting the data to the next stage. Multipliers are shown at $A_{-4}$–$A_4$, and adders are indicated at ADD.

Figure 7A:
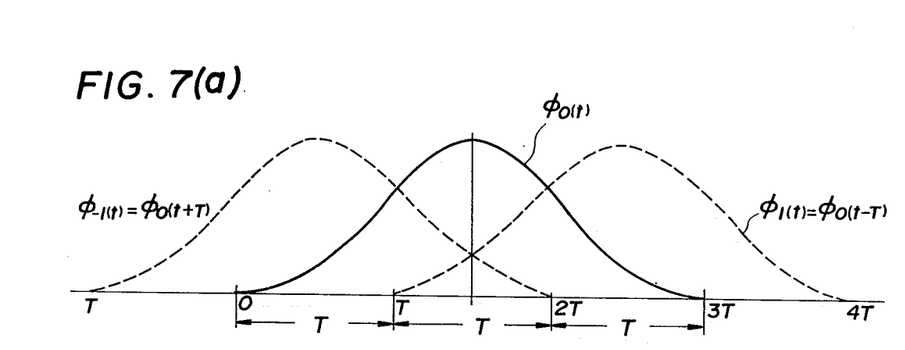
FIG. 7(a) shows waveform diagrams of $\phi_{-1}(t)$, $\phi_0(t)$ and $\phi_1(t)$.
Figure 7B:
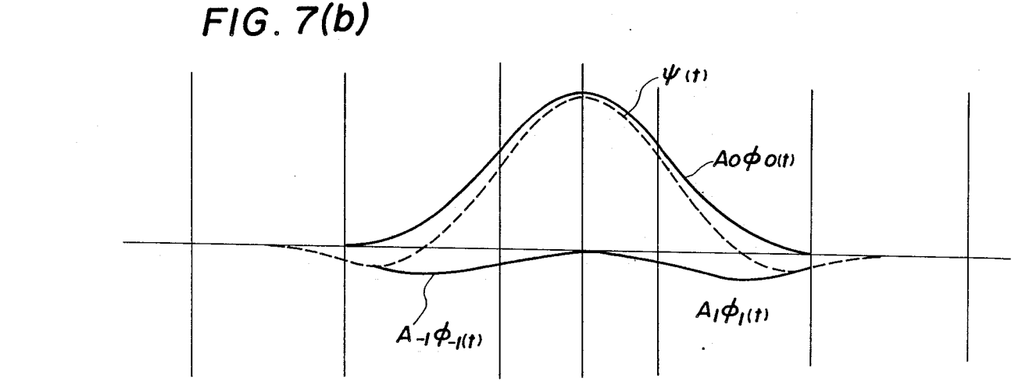
FIG. 7(b) shows a waveform diagram of $A_K \phi_K(t)$.

The signal generator 14 includes the aforementioned function generators $14_{-1}, 14_0, 14_1$ for repeatedly generating signals having the respective functions $\phi_0(t+T)$, $\phi_0(t)$, $\phi_0(t-T)$ of period 3T shown in FIG. 7(a).

Figure 11:
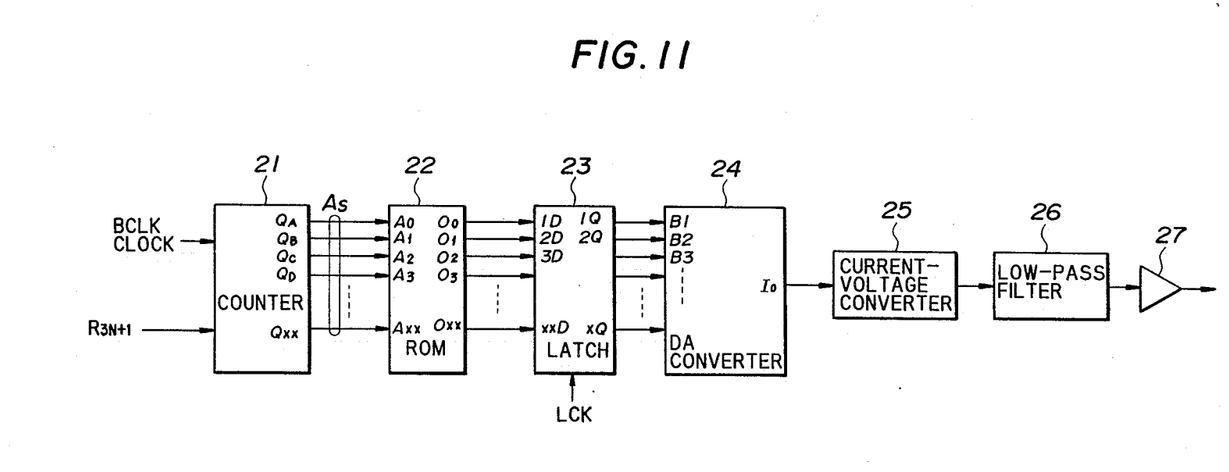
FIG. 11 is a block diagram of a function generator.

FIG. 11 is a block diagram of the function generator $14_{-1}$. The function generator $14_{-1}$ includes: a counter 21, which has its count cleared by a reset pulse $R_{3N+1}$ (the same as the data latching pulse $P_{3N+1}$), and which counts the bit clock signal BCLK of frequency $a \cdot f_s$ (where $f_s$ is the sampling frequency) and generates an address signal $A_S$ of a ROM 22, which is the next stage; the ROM 22, which sequentially stores, in the order of its addresses, the digital values of function $\phi_0(t)$ digitized at the interval $1/(a \cdot f_s)$, and from which the digital data are successively read from storage areas designated by the address signals $A_S$ outputted by the counter 21, thereby generating the discrete function $\phi_0(t)$; a latch circuit 23 for latching the digital data outputted by the ROM; a DA converter 24 for converting the output of the latch circuit 23 into a current $I_0$ having a magnitude proportional to the digital value inputted thereto; a current-voltage converter (IV converter) 25 for converting the current value $I_0$ from the DA converter 24 into a voltage signal proportional to the current value $I_0$; a low-pass filter 26 for forming the output of the IV converter into a smooth, continuous analog signal; and an amplifier 27. The function generators $14_0, 14_1$ have almost the same arrangement as the function generator shown in FIG. 11. The only difference is that the count in counter 21 is reset by the reset pulse $R_{3N+2}$ or $R_{3N+3}$ (the same as data latching pulse $P_{3N+2}$ or $P_{3N+3}$) instead of the reset pulse $R_{3N+1}$. It should be noted that the function generator $14_{-1}$ outputs the repeating function $\phi_0(t+T)$ of period 3T from time $-T$, the function generator $14_0$ outputs the repeating function $\phi_0(t)$ of period 3T from time 0, and the function generator $14_1$ outputs the repeating function $\phi_0(t-T)$ of period 3T from time T.

The multiplier 15 has the three multiplying-type DA converters $15_{-1}$–$15_1$. The multiplying-type DA converter $15_{-1}$ multiplies the total value $C_{-1}$ of the coefficients of Eq. (9) stored in the latch circuit $13_{-1}$ by the function signal $\phi_0(t+T)$ and outputs the product as analog signal $M_{-1}$, the multiplying-type DA converter $15_0$ multiplies the total value $C_0$ of the coefficients of Eq. (8) stored in the latch circuit $13_0$ by the function signal $\phi_0(t)$ and outputs the product as analog signal $M_0$, and the multiplying-type DA converter $15_1$ multiplies the total value $C_1$ of the coefficients of Eq. (10) stored in the latch circuit $13_1$ by the function signal $\phi_0(t-T)$ and outputs the product as analog signal $M_1$.

The mixer 16 has the construction of a well-known analog adder for combining the analog signals $M_{-1} \sim M_1$ outputted by the multiplying-type DA converters $15_{-1} \sim 15_1$, thereby producing the output analog signal $S_A$.

In accordance with the present invention as described hereinabove, the unit pulse response signal $\psi(t)$ is expressed using simple, short-term functions $\phi_K(t)$ and coefficients $A_K$ in the manner $$\psi(t) = \Sigma A_K \cdot \phi_K(t) \quad (K = -\infty \sim +\infty)$$

processing for calculation of $A_K$ is performed in advance by a digital signal processor, the function signal $\phi_K(t)$ is generated as is without being partitioned, the function is multiplied by the coefficients and the results are combined. This makes it possible to generate a continuous analog signal that is free of phase distortion, to reduce the number of circuit units such as the multiplying-type DA converters to three, and to obtain an analog output that is free of noise, has an excellent S/N ratio and exhibits no fluctuation in level.

As many apparently widely different embodiments of the present invention can be made without departing from the spirit and scope thereof, it is to be understood that the invention is not limited to the specific embodiments thereof except as defined in the appended claims.

What we claim is:

1. A digital-analog converting method for converting digital data successively generated every predetermined sampling period T into a continuous analog signal, comprising the steps of:

successively generating digital data $V_K$ ($K = \ldots, -4, -3, -2, -1, 0, 1, 2, 3, \ldots$) every predetermined sampling period T;

repeatedly generating, successively at a period 3T, signals $\phi(t+T)$, $\phi(t)$, $\phi(t-T)$, where a unit pulse response signal $\psi(t)$ is expressed by $$\psi(t) = \Sigma A_K \cdot \phi(t - K \cdot T) \quad (K = -\infty \sim +\infty)$$

using a signal $\phi(t)$ ($0 \leq t \leq 3T$) expressed by three piecewise polynomials;

computing C in accordance with the equation $$C = \Sigma A_{-K} \cdot V_K$$

($K = -M \sim M$, where M is an integer) every sampling period T, where $V_0$ represents digital data prevailing at the present time, and cyclically storing the results of computation as $C_{-1}, C_0, C_1$ in successive fashion; and generating a continuous analog signal by converting the digital data into an analog quantity in accordance with the equation $$C_{-1} \cdot \phi(t+T) + C_0 \cdot \phi(t) + C_1 \cdot \phi(t-T)$$

2. The method according to claim 1, wherein the three piecewise polynomials expressing said signal $\phi(t)$ are $$\phi(t) = (9/2) \cdot (t/3T)^2 \quad (0 \leq t < T)$$

$$\phi(t) = -9 \cdot (t/3T - \tfrac{1}{2})^2 + \tfrac{3}{4} \quad (T \leq t < 2T)$$

$$\phi(t) = (9/2) \cdot (t/3T - 1)^2 \quad (2T \leq t < 3T)$$

and $A_K$ is expressed by the equation $$A_K = \sqrt{2} (-3 + 2\sqrt{2})^{|K|}$$

3. The method according to claim 2, wherein a value of the signal $\phi(t)$ is discretely stored in a ROM beforehand at a time interval of $1/a_s$ of the sampling period T, a bit clock generated at a period $1/a_s$ is counted, numerical values are successively read out of the ROM from addresses indicated by the counted value and the numerical values are converted into voltages to generate the analog signal $\phi(t)$, and signals $\phi(t+T)$, $\phi(t-T)$ are generated in a manner similar to the signal $\phi(T)$.

4. A digital-analog converting apparatus for converting digital data successively generated every predetermined sampling period T into a continuous analog signal, comprising:

digital data generating means for successively generating digital data $V_K$ ($K = \ldots, -4, -3, -2, -1, 0, 1, 2, 3, \ldots$) every predetermined sampling period T;

signal generating means for repeatedly generating, successively at a period 3T, signals $\phi(t+T)$, $\phi(t)$, $\phi(t-T)$, where a unit pulse response signal $\psi(t)$ is expressed by $$\psi(t) = \Sigma A_K \cdot \phi(t - K \cdot T) \ (K = -\infty \sim +\infty)$$

using a signal $\phi(t)$ ($0 \leq t \leq 3 \cdot T$) expressed by three piecewise polynomials;

arithmetic means for computing C in accordance with the equation $$C = \Sigma A_{-K} \cdot V_K$$

($K = -M \sim M$, where M is an integer) every sampling period T, where $V_0$ represents digital data prevailing at the present time;

memory means for cyclically storing C, which is computed by said arithmetic means every period T, as $C_{-1}$, $C_0$, $C_1$ in successive fashion;

three sets of multplying means for respectively computing $$C_{-1} \cdot \phi(t+T), \ C_0 \cdot \phi(t), \ C_1 \cdot \phi(t-T)$$

and mixing means for combining outputs from said three sets of multplying means to generate a continuous analog signal.

5. The apparatus according to claim 4, wherein the three piecewise polynomials expressing said signal $\phi(t)$ are $$\phi(t) = (9/2) \cdot (t/3T)^2 \ (0 \leq t < T)$$

$$\phi(t) = -9 \cdot (t/3T - \tfrac{1}{2})^2 + \tfrac{3}{4} \ (T \leq t < 2T)$$

$$\phi(t) = (9/2) \cdot (t/3T - 1)^2 \ (2T \leq t < 3T)$$

and $A_K$ is expressed by the equation $$A_K = \sqrt{2}(-3 + 2\sqrt{2})^{|K|}$$

6. The apparatus according to claim 4, wherein a value of the signal $\phi(t)$ is discretely stored in a ROM beforehand at a time interval of $1/a_s$ of the sampling period T, a bit clock generated at a period $1/a_s$ is counted, numerical values are successively read out of the ROM from addresses indicated by the counted value and the numerical values are converted into voltages to generate the analog signal $\phi(t)$, and signals $\phi(t+T)$, $\phi(t-T)$ are generated in a manner similar to the signal $\phi(T)$.

7. The apparatus according to claim 6, wherein each of said multiplying means comprises a multiplying-type DA converter.

* * * * *